United States Patent [19]
Clark et al.

[11] Patent Number: 5,671,256
[45] Date of Patent: Sep. 23, 1997

[54] METHOD FOR DECODING A DIGITAL SIGNAL

[75] Inventors: Joseph Lynn Clark, Fort Worth; Kevin Gordon Brown, North Richland Hills, both of Tex.; Allan Arthur Budlong, Redmond, Wash.; Jeff Ricks Stripling, Fort Worth, Tex.

[73] Assignee: Motorola, Inc., Schaumburg, Ill.

[21] Appl. No.: 439,192

[22] Filed: May 11, 1995

Related U.S. Application Data

[63] Continuation-in-part of Ser. No. 877,929, May 4, 1992, abandoned.

[51] Int. Cl.$^6$ .................................................. H03D 1/00
[52] U.S. Cl. ........................... 375/342; 375/254; 375/355; 371/37.9; 371/57.2
[58] Field of Search ........................... 375/243, 245, 375/254, 316–317, 337, 340, 342, 350, 353, 355, 369; 371/37.9, 31, 57.2; 341/63–64, 68–69, 132, 143

[56] References Cited

U.S. PATENT DOCUMENTS

| | | | |
|---|---|---|---|
| 4,242,755 | 12/1980 | Gauzan | 375/342 X |
| 4,696,018 | 9/1987 | Zaehringer et al. | 375/328 |
| 4,769,760 | 9/1988 | Kroll et al. | 364/487 |
| 5,052,021 | 9/1991 | Goto et al. | 375/317 |
| 5,159,281 | 10/1992 | Hedstrom et al. | 375/342 X |

*Primary Examiner*—Young T. Tse
*Attorney, Agent, or Firm*—Bruce Terry

[57] ABSTRACT

A received signal is sampled and a mean is calculated. A zero crossing sample is then located and used to locate a starting sample and the samples are read from that point forward, using sampling intervals and mean crossings, to decode the bit stream. Alternatively, first and second derivatives of the signal are calculated. A sign (±) of the first derivative sample at the first zero crossing of the second derivative is used to determine the sign of a sample. The second derivative of the signal is then read, using sampling intervals and the sign of the first derivative, to decode the bit stream. In another alternative, samples are used to calculate a rolling average of the samples. The rolling average of the sample is compared to the sample to determine the logic value of the sample based upon whether the sample is above or below the rolling average.

10 Claims, 6 Drawing Sheets

| BIT | 0 | 0 | 1 | 1 | 0 | 1 | |
|---|---|---|---|---|---|---|---|
| SAMPLE | 00000 | 00100 | 01111 | 11111 | 00000 | 11111 | 0 • • • |
| | 4 | 9 | 14 | 19 | 24 | 29 | |

| SAMPLE # | 11    15 | 16    20 | 21    25 | 26    30 | 31    35 | 36    40 | 41 |
|---|---|---|---|---|---|---|---|
| LOGIC VALUE | 00000 | 01111 | 11000 | 01111 | 11000 | 00000 | 01 • • • • |
| BIT | 0 | 1 | 0 | 1 | 0 | 0 | |

| SAMPLE# | 1 | 5 | 6 | 10 | 11 | 15 | 16 | 20 | 21 | 25 | 26 | 30 | 31 | 35 |
|---|---|---|---|---|---|---|---|---|---|---|---|---|---|---|
| LOGIC VALUE | 1111 | 0 | 0000 | 0 | 00000 | 1 | 1111 | 1 | 110 | 0 | 0 | 0 | | |
| BIT(UNADJUSTED) | 1 | | 0 | | 0 | | 1 | | 0 | | | | | |
| BIT(ADJUSTED) | 1 | | 0 | | 0 | | 1 | | 1 | | | | | |

METHOD FOR DECODING A DIGITAL SIGNAL

RELATED APPLICATIONS

The present application is a continuation-in-part of U.S. patent application Ser. No. 07/877,929 filed on May 4, 1992, now abandoned.

FIELD OF THE INVENTION

The present invention relates, in general, to a method for decoding a digital signal and, more particularly, to a method for decoding a Digital Sub-Audible Tone (DSAT).

BACKGROUND OF THE INVENTION

To receive a communication signal in a cellular communication system wherein a cell is divided into sectors, a base site will scan each of the sector antennas to determine which antennas receive the strongest signal from the subscriber unit. Typically a Receive Signal Strength Indicator (RSSI) will be measured to determine which antenna is receiving the strongest signal. In one particular embodiment, a six sector cell will be used. After measuring the RSSI at all six antennas, the three antennas receiving the strongest RSSI signals will be selected.

The system then determines if a Digital Sub-Audible Tone (DSAT), being transmitted by the subscriber, is present. In one method of operation, if DSAT is present at the strongest antenna, this antenna will be selected and the process will stop there. In another method of operation, the system will check each of the three antennas to determine if DSAT is present. The collected information will be passed along to the system host which will determine which antenna to select (if DSAT is present on more than one antenna).

The DSAT signal is typically a 200 bit per second Non-Return to Zero (NRZ) bit stream. The bit stream consists of one of seven 24 bit patterns. Each 24 bit pattern has no more than two logical ones or zeros in a row. During a call, the DSAT is periodically monitored to make hand-off determinations, either between sectors or cells. When a DSAT detection is conducted, the signal is sampled once every millisecond.

The current method of performing a DSAT detection is to use an analog comparator, or bit slicer. The bit slicer compares the instantaneous voltage level of the received signal with an average level. The average level is generated with a low pass filter having a time constant of 1.2 sec. One problem in using the bit slicer is that the measurement process must be delayed giving the bit slicer time to adjust to the incoming signal.

A second problem arises in the errors that may result during measurement. In order to obtain a valid DSAT signal, there may be no more than two errors. Errors may result from conditions outside the control of the measuring device, such as noise in the other antennas during RSSI measurements causing a DC shift in the receiver or like problems; or from conditions within the control of the measuring device, such as an error occurring at the beginning of a string because measurements were taken while waiting for bit slicer to settle out.

Therefore, it is important to reduce the time necessary to make the desired measurements as well as improve the measurement system by eliminating as many internal error causing elements as possible.

SUMMARY OF THE INVENTION

In one implementation of the present invention, a method for decoding a digital signal is provided which consists of sampling a received signal; and calculating a mean of the samples. The samples are then scanned in reverse order to find a mean crossing sample of the samples. The mean crossing sample is used to determine a starting point for reading the signal. The sampling intervals and mean crossings are then used to decode the bit stream.

In a second method, the signal is sampled and first and second derivatives of the samples are calculated. A sign (±) of the first derivative at the first zero crossing of the second derivative is used to determine the sign of a sample taken from the second derivative. The second derivative of the signal is then read, using sampling intervals and the sign of the first derivative, to decode the bit stream.

A third method samples the signal and calculates a rolling average of the signal. The rolling average of the sample is compared to the sample to determine the sign of the sample. A bit value is assigned to each sample based upon whether the sample is above or below the rolling average.

DETAILED DESCRIPTION OF THE DRAWINGS

Figure 1:
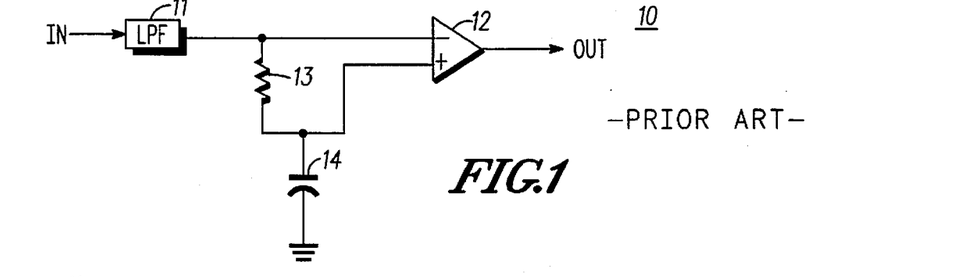
FIG. 1 is a block diagram of a prior art analog circuit used for signal decoding.

Referring initially to FIG. 1, a block diagram, generally designated 10, of a prior art analog circuit is illustrated. Circuit, or bit slicer, 10 consists of a low pass filter (LPF) 11 coupled to a comparator 12 through an RC network consisting of resistor 13 and capacitor 14, where RC>1 μsec.

As discussed above, the problem with circuit 10 is that it has a slow ramp-up time, as a result of the RC network, which may result in errors at the beginning of the measurement. This is illustrated by line 21 in graph 20 of FIG. 2. In graph 20, the abscissa is the voltage of the received signal and the ordinate is time. When the measurement begins, it takes up to time $t_1$ for the circuit to settle out where the measurements taken can be considered valid. This delay will be greater for lower frequency signals since it will take longer for the RC circuit to charge. In addition, if the measurements are started at a time prior to $t_1$, errors will be generated which can jeopardize the entire process.

The circuit of FIG. 1 can provide erroneous readings when noise, such as noise spike 22, is encountered. This noise spike will be read as a transition of the signal inserting, in this case, a false "1" into the bit stream.

Figure 3:
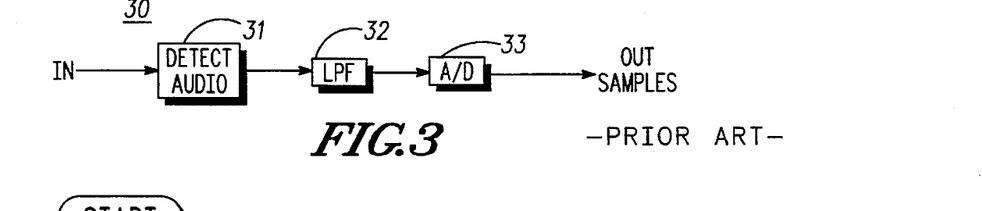
FIG. 3 is a block diagram of a data detector embodying the present invention.

In FIG. 3, a block diagram of a data decoding circuit, generally designated 30, embodying the present invention is illustrated. Circuit 30 consists of a detect audio circuit 31, a low pass filter (LPF) 32, an analog-to-digital (A/D) converter 33, and a processor 34. One possible embodiment of processor 34 is a microprocessor including a memory 38 and logic unit 35 operable so as to function, with appropriate programming, to process the output samples as described below into digital output data bits, including functioning in part as a bit counter 36 and sample counter 37; a skilled artisan will appreciate that numerous alternative processors, integrated or not, may be used in carrying out the below processes. Using circuit 30 in accordance with the methods described below will permit a new reference to be calculated starting at any point in time since there is no RC time constant causing a delay.

Figure 4:
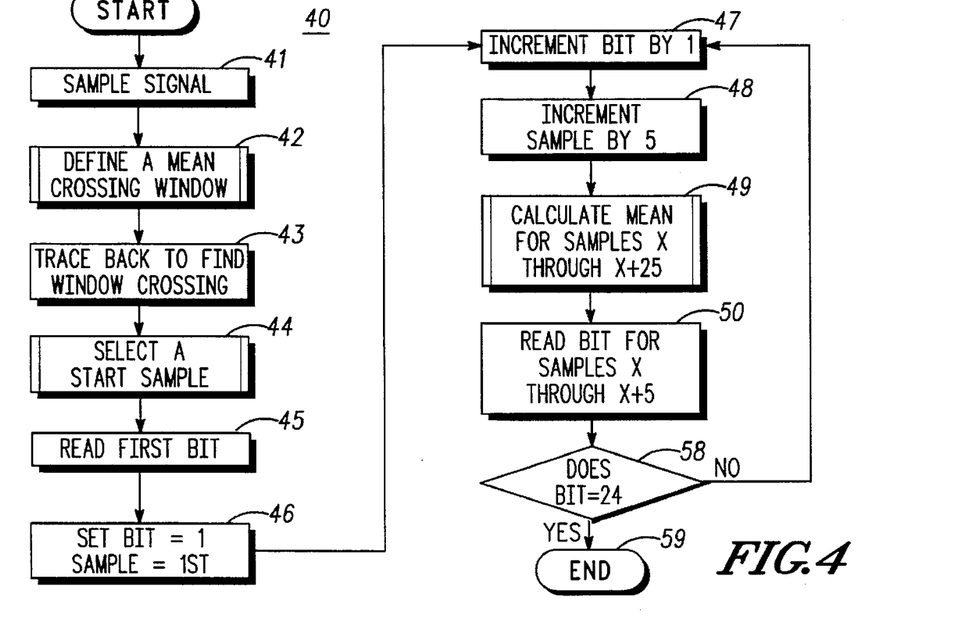
FIGS. 4-6 are flow charts illustrating a first process embodying the present invention.

A first process, generally designated 40, for utilizing circuit 30 is illustrated in the flow chart of FIG. 4 and performed by processor/controller 34. Process 40 commences at step 41 by sampling a signal by A/D 33, such as signal 71 illustrated in FIG. 7. In this embodiment, signal 71 is sampled 25 times at a sampling rate of one sample per msec. This results in five samples (e.g., the out samples of FIG. 3) being taken per bit time (5 msec). Process 40 then proceeds to subprocess 42 where a mean crossing window, or mean range, is defined.

Figure 5:
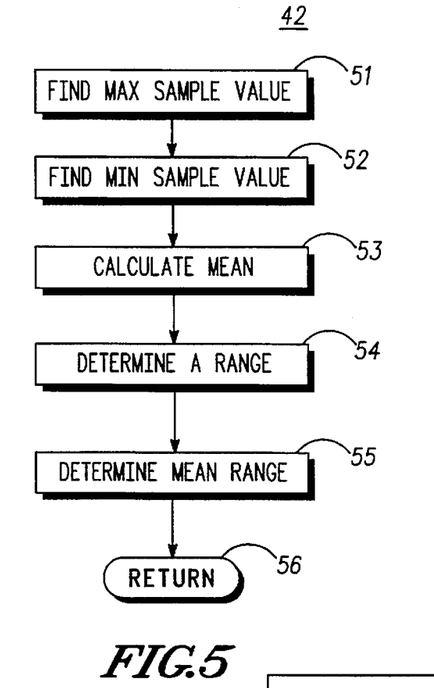
Figure 7:
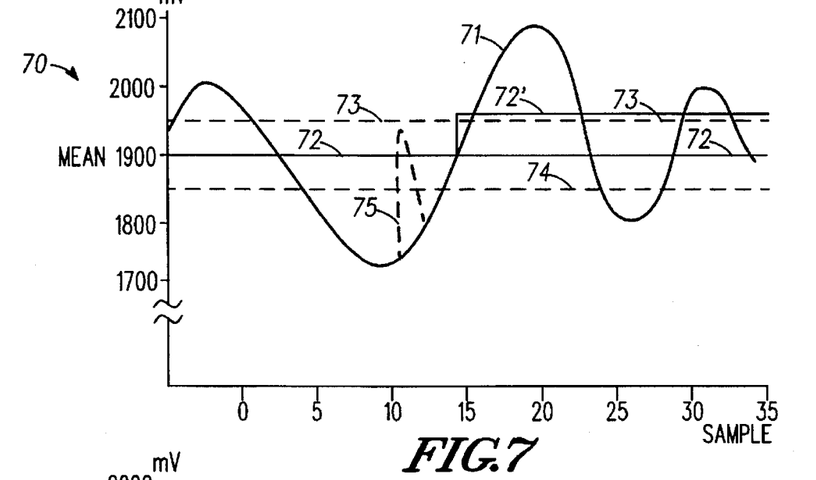
FIG. 7 is a graph of a signal illustrating the operation of the embodiment of FIGS. 4-6.

Subprocess 42 is illustrated in FIG. 5 commencing with finding the maximum sample value, step 51. A voltage of 2100 mV will be used as the maximum value in this example, which occurs at sample time 19. Next, the minimum sample voltage is determined, step 52. As shown in FIG. 7, a voltage of 1700 mV is found around sample time 9. In step 52, the mean of the sample values is determined by averaging the MAX and MIN signals. This provides a mean value of 1900 mV as illustrated by line 72.

Once a mean value has been determined, a range, or window width, is calculated in processor 34, step 54. The window width is determined by taking a fraction, or percentage, of the maximum amplitude. For example in FIG. 7, the maximum amplitude is 400 mV (2100-1700). The amplitude (AMP) is then divided by a preselected constant, such as 8, to provide a window offset of 50 mV (400/8). The mean range is then determined, step 55, by taking the mean ±window. In this example the window would be 1850-1950 mV, as illustrated by dashed lines 73 and 74, FIG. 7. Subprocess 42 then returns to process 40.

The window determined in subprocess 42 is then used to trace back along the samples, starting at sample 25, until a sample is found falling within the window, step 43. As shown in FIG. 7, sample 24 is the first sample encountered which falls within the window. Process 40 then selects a start sample using the sample found in step 43, subprocess 44.

Figure 6:
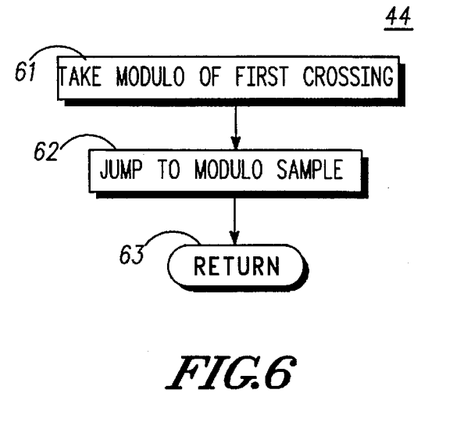

Subprocess 44 is illustrated in FIG. 6. Subprocess 44 takes a modulo value of the window crossing sample number, step 61, and jumps to the sample number corresponding to that modulo number, step 62. Subprocess 44 then returns, step 63. By way of example, it was determined above that sample 24 was the first sample encountered within the window. Using modulo-5 as an example, 24 modulo-5 results in 4. Therefore, the system will jump to sample 4 to begin reading the samples taken of signal 71.

Following subprocess 44, process 40 reads the first bit of the signal, step 45. In reading the digital signal represented by the samples of signal 71, a value of "1" is given to any sample above mean 72 and a "0" is assigned to any value below mean 72. Starting with sample number 4, the "0" and "1" assignments are shown in the SAMPLE row of FIG. 8. These samples are then arranged into groups of five to determine the bit value represented by the samples. This is illustrated in the BIT row of FIG. 8. The samples forming the first bit are samples 4 through 8, inclusive, which provide a digital "00000" sample.

Figure 8:
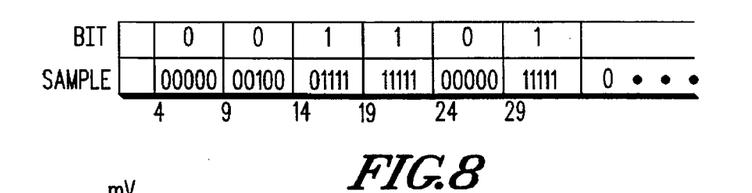
FIG. 8 represents, in graphical form, a digital interpretation of the signal of FIG. 7.

The bit values are determined by majority voting of the samples read. As an example, the samples forming the third bit in FIG. 8 show one "0" sample and four "1" samples. Therefore, the bit is read as a 1 bit. This will occur due to noise in the signal or because of an offset in the measurements. The majority voting will eliminate any problems caused by noise. An example of this is shown by the noise signal represented by dashed line 75. This has caused an erroneous "1" to appear in the second bit samples. However, because of the majority voting, the sample error caused by the noise is corrected. This will also handle the sample stream offset by shifting the bit stream backward or forward by one bit. However, since the bit order is not effected, an accurate DSAT signal (if present) will be decoded.

Figure 2:
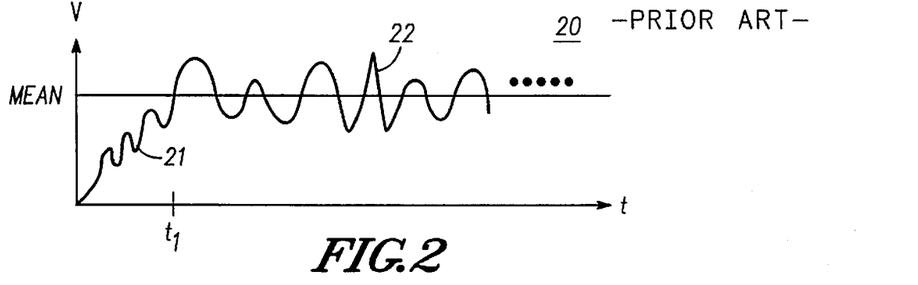
FIG. 2 is a graph illustrating the operation of the prior art analog circuit.

It should be noted here that since the RC network has been eliminated, there is no start-up waiting period that must be accounted for at the beginning of the signal, as can be seen by a comparison of FIGS. 2 and 7. Therefore, this process does not waste time by discarding the front end of a signal.

Once the first bit has been determined, process 40 continues to step 46 where a BIT counter is set to "1" and a SAMPLE counter is set to the first sample number, "4", determined in subprocess 44. The BIT counter is then incremented by 1, step 47; and the SAMPLE counter is incremented by 5, step 48. In this example, the BIT counter is now 2 and the SAMPLE counter is now 9.

Next, in subprocess 49, a new mean value is calculated. This is performed in the same manner as used in subprocess 42, FIG. 5, except that the range of samples used is X through X+25, or 9 through 34. As shown in graph 70, the minimum and maximum values are still at sample points 9 and 19, respectively. Therefore, the mean will remain at line 72 for the second bit.

In step 50, the second bit is determined using samples X through X+5. In this example, bits 9 through 13, inclusive, are used to determine bit 2. The sample stream here is "00100" (where the "1" represents noise), resulting in a "0" bit reading.

After reading the bit value, process 40 determines if the bit read was the 24th bit, decision step 58. If this was bit 24, then the process would end, step 59. If this bit was not the 24th bit, then process 40 would loop back to step 47.

In processing the third bit, the minimum value of the sample stream has changed since bit 9 is no longer in the range being examined (14–39). The new minimum is 1820 mV and is found at sample bit 27. The mean value is then adjusted to 1960 mV, (1820+2100)/2, line 72'. The third bit, samples 14 through 18, is then read using new mean 72'.

This resetting of the mean allows the process to compensate for variations caused in signal drift during reception. Once the 24 bits have been decoded, the result is matched with the known DSAT codes to determine if the code received is a valid code. If valid, service is provided by the system; if invalid, service is denied.

Figure 9:
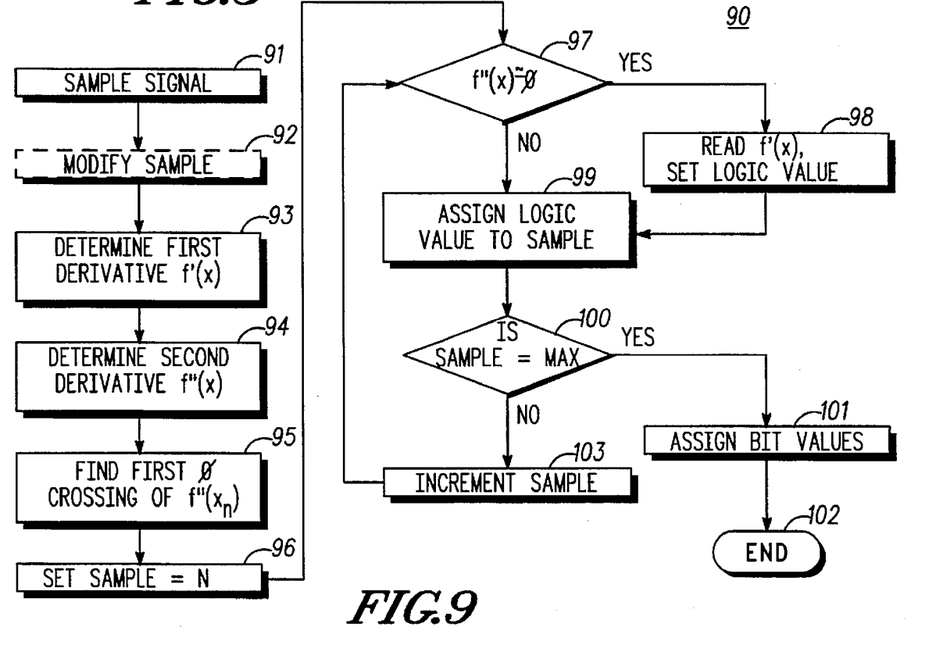
FIG. 9 is a flow chart illustrating a second process embodying the present invention.
Figure 10:
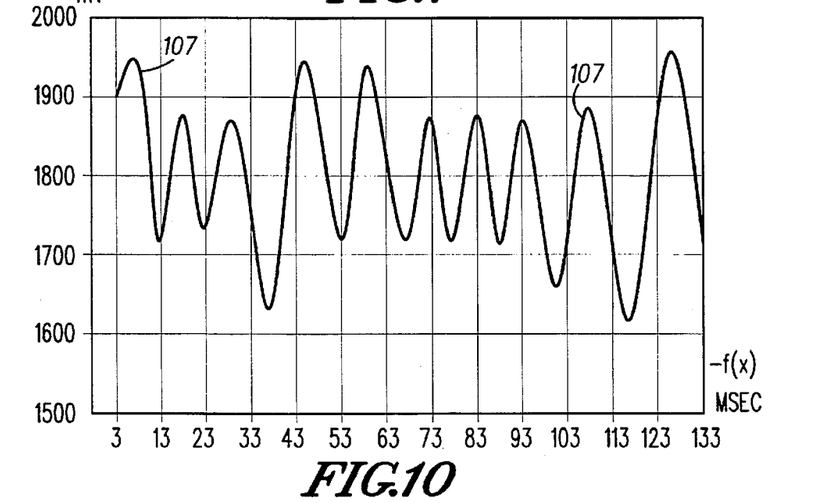
FIGS. 10 and 11 are graphs of a signal being processed in accordance with the embodiment of FIG. 9.

Referring now to FIG. 9, a flow chart of a process, generally designated 90, of a second embodiment of the present invention is illustrated. Process 90 commences by taking a signal sample, step 91. The signal may then optionally be modified to smooth out the sampling process, step 91. A modified signal, designated 107, is illustrated in FIG. 10. In one preferred embodiment, the signal is modified by averaging successive samples. Signal 107 could then be defined by equation (1).

$$f(x)=(x1+x2)/2 \quad (1)$$

Figure 11:
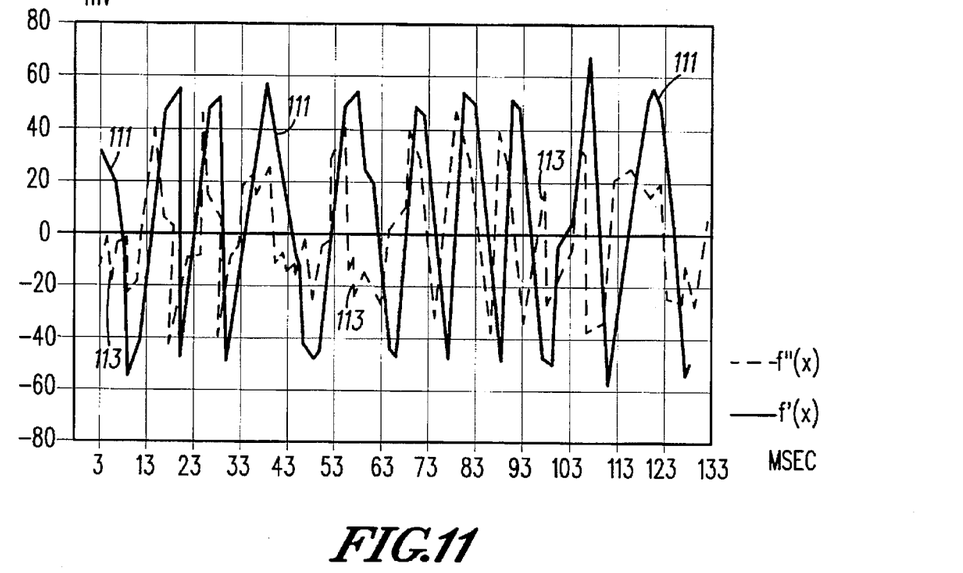

Process 90 then determines the first, f'(x), and second, f"(x), derivatives of signal f(x), steps 93 and 94, respectively. These derivatives are illustrated in the graph of FIG. 11 where f'(x) is line 111 and f"(x) is line 113.

Process 90 then locates a sample N of a first zero crossing of the f"(x) signal, step 95. Since the second derivative will cross the zero line at approximately the same point as signal f(x) would cross a mean point, this zero crossing sample (N) will represent the start of the first full bit of signal f(x). A SAMPLE counter will then be set to the value N of the zero crossing sample, step 96. In the example provided in FIG. 11, this sample point will be approximately sample 11. Therefore, SAMPLE will initially be set to 11.

In decision step 97, the process will determine if the f"(x) value for SAMPLE is approximately zero. If it is, which it will be for the first N value, the f'(x) signal is read to determine if it is greater than, or less than, zero, step 98. Since f"(x) is a derivative of f'(x), there is no possibility of both signals being equal to zero at the same time. If f'(x) is greater than zero, a LOGIC VALUE variable is set to "1" If f'(x) is less than zero, the LOGIC VALUE is set to "0". This logic value will then be assigned to the sample, step 99.

The system will then determine if the SAMPLE variable is at a maximum. In the present embodiment, taking five samples per bit time and needing 24 bits, a total of 120 samples will be required. If the sampling starts at sample bit 11, then the maximum sample bit will be set to 131. Once this bit sample is reached, process 90 will assign the bit values based on a majority vote of the five samples making-up the bit, step 101. The process would then end, step 102.

If the SAMPLE variable has not reached the maximum number, then process 90 will continue to step 103 from decision step 100. At step 103 the SAMPLE variable is incremented and process 90 loops back to step 97.

Figure 12:
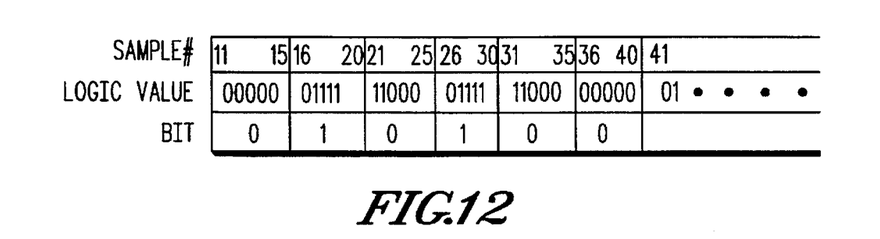
FIG. 12 represents, in graphical form, a digital interpretation of the signal of FIG. 10.

An example of process 90 being applied is given with reference to the graph of FIG. 11 and shown in the graphical form in FIG. 12. As pointed out above, the first zero crossing occurs at sample 11. At sample 11, f'(x) is less than zero. Therefore, the LOGIC VALUE variable will be set to "0". This LOGIC VALUE will continue to be assigned to each sample until another zero crossing is detected. The next zero crossing in FIG. 11 occurs at SAMPLE 17. Here, f'(x) will again be evaluated and found that it is greater than zero. Therefore, the LOGIC VALUE variable will be set to "1". This process will continue until LOGIC VALUES have been assigned to 120 samples.

The samples are then placed in groups of five, and evaluated to determine the bit values. In this example, the first six bits are "010100".

In an alternative embodiment, each time five samples have been determined, the bit value can be assigned without waiting for the SAMPLE VALUES of all the samples to be determined.

Figure 13:
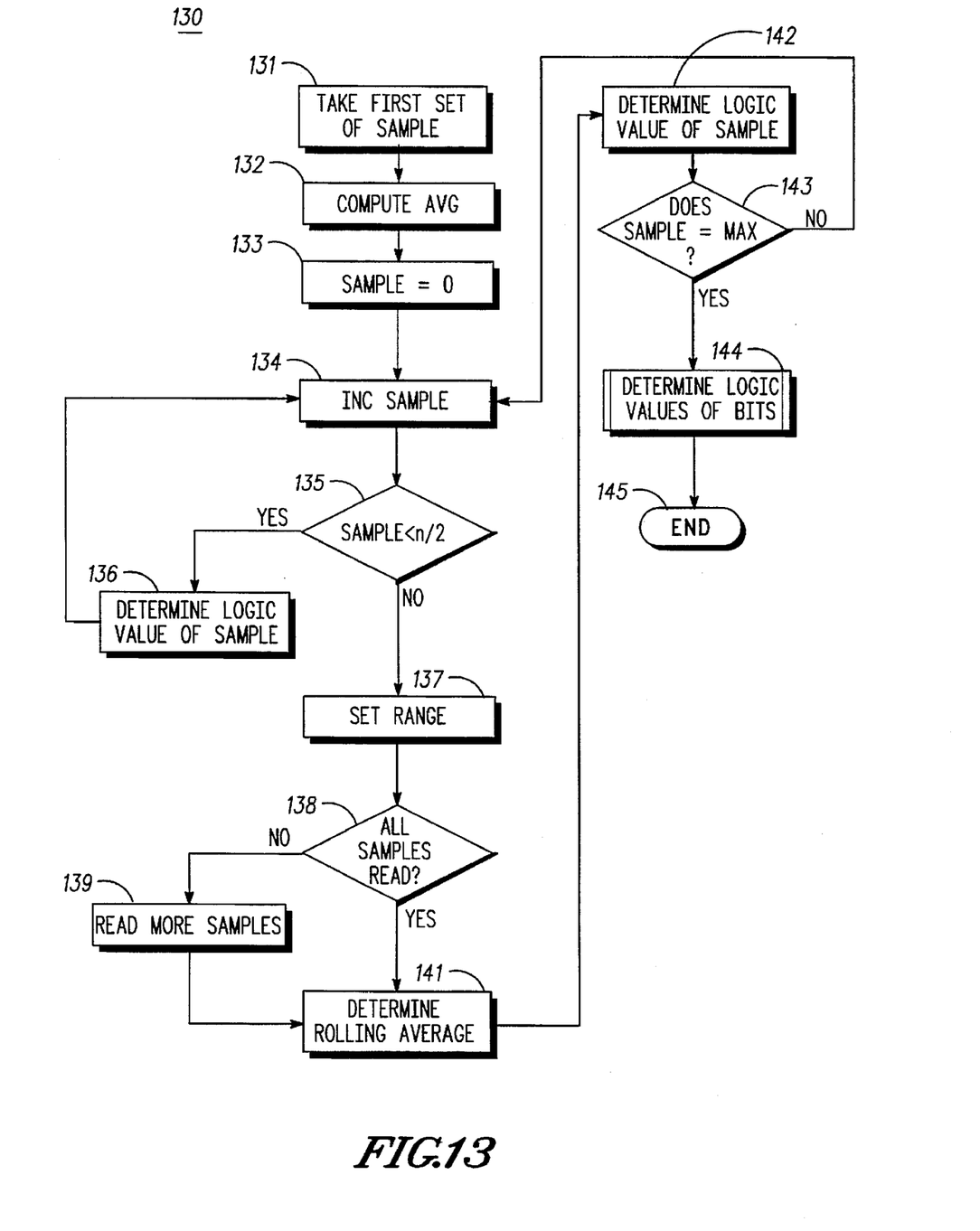
FIG. 13 is a flow chart illustrating a third process embodying the present invention.

Referring now to FIG. 13, a flow chart of a third process, generally designated 130, embodying the present invention is illustrated. Process 130 describes a method of using a rolling average compared with the signal to determine the logic value of a sample. The rolling average is determined using equations (2) and (3) below.

$$A_k = \frac{\sum_{m=0}^{n} S_m}{n} \quad \text{for } k < \frac{n}{2} \quad (2)$$

and $$A_k = \frac{\sum_{m=k-\frac{n}{2}}^{k+\frac{n}{2}-1} S_m}{n} \quad \text{for } k \geq \frac{n}{2} \quad (3)$$

where:

$S_m$ is the sample value;

$A_k$ is the average value to be compared with the sample value $S_i$;

n is the number of samples used to determine the average; and k is number of the sample.

Process 130 commences at step 131 where a first set of samples are read. This first set of samples may be any number of samples, but is preferably an even positive integer. For this example, 16 will be used as the number of samples (n). The average of this set is then computed, step 132.

Figure 14:
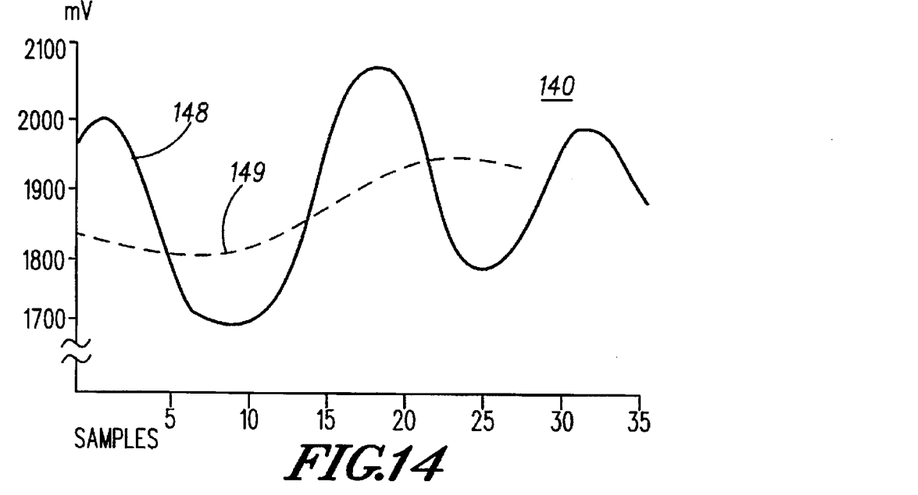
FIG. 14 is a graph of a signal being processed in accordance with the embodiment of FIG. 13.
Figure 15:
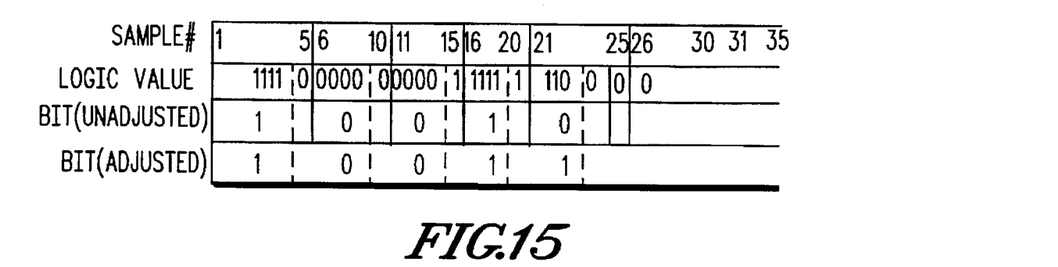
FIG. 15 represents, in graphical form, a digital interpretation of the signal of FIG. 14.

In step 133, a SAMPLE variable representing the sample number is set to 0. In step 134, SAMPLE is incremented, now being 1. Decision step 135 then determines if the SAMPLE is less than n/2, or 8 in this example. Since 1<8, process 130 goes to step 136 and determines the logic value of the sample. Referring to graph 140 of FIG. 14, a signal 148 and a rolling average 149 are illustrated. At sample point 1, the signal is greater than the rolling average. Therefore, a logical value of "1" is assigned to the first sample. This is illustrated in the chart of FIG. 15.

Process 130 will then loop back to step 134 where the SAMPLE variable is incremented. This will continue until a SAMPLE value is reached which is not less than n/2, or in this example a SAMPLE value greater than 7. During this time, the average is not changed. The results for the first seven loops through step 136 are shown in FIGS. 14 and 15.

Once the SAMPLE number is not less than n/2, process 130 will proceed to step 137 from decision step 135. In step 137, a range is determined over which an average value will be determined. For purposes of this example, the range used is from n−7 to n+8, giving 16 samples. Therefore, for the 8th SAMPLE, the average will be taken over samples 1 through 16.

Process 130 must then determine if all of the samples necessary to calculate the average have been read, decision step 138. If not, step 139, then more samples are read. In one particular embodiment, they are read five samples at a time until all the necessary samples have been read. Once all of the samples necessary to calculate the average have been read, the rolling average is determined, step 141.

Process 130 then determines the logic value for the sample by comparing the sample with the rolling average, step 142. The result of steps 141 and 142 are illustrated in FIGS. 14 and 15, respectively. The method of recomputing the rolling average and assigning a logic value to the sample is continued until a logic value has been assigned to the maximum logical value, decision step 143. If the maximum sample has not been reached, process 130 loops back to step 134 and increments the SAMPLE variable.

If the maximum sample value has been reached, process 130 proceeds to a subprocess 144 to assign a logical value to each of the bits. Process 130 would then end, step 145. In using majority voting, a bit stream of "10010" would result. However, as can be seen with a comparison of the first process in FIGS. 7 and 8, the bit streams are different. In the first process a bit stream of "X001101" was obtained, whereas in the third process, using the same signal, a bit stream of "10010" is obtained. As shown, there is a difference in the fifth bit. This is a result of how the samples are grouped to form bits. Because of a shift in the bits, a "1" which should be used in FIG. 15 to determine the fifth bit is pushed back into the third bit. As a result, the single "1" sample in the third bit and the two "1" samples in the fifth bit have been out voted by the "0" samples. Subprocess 144 is designed to alleviate this potential problem.

Figure 16:
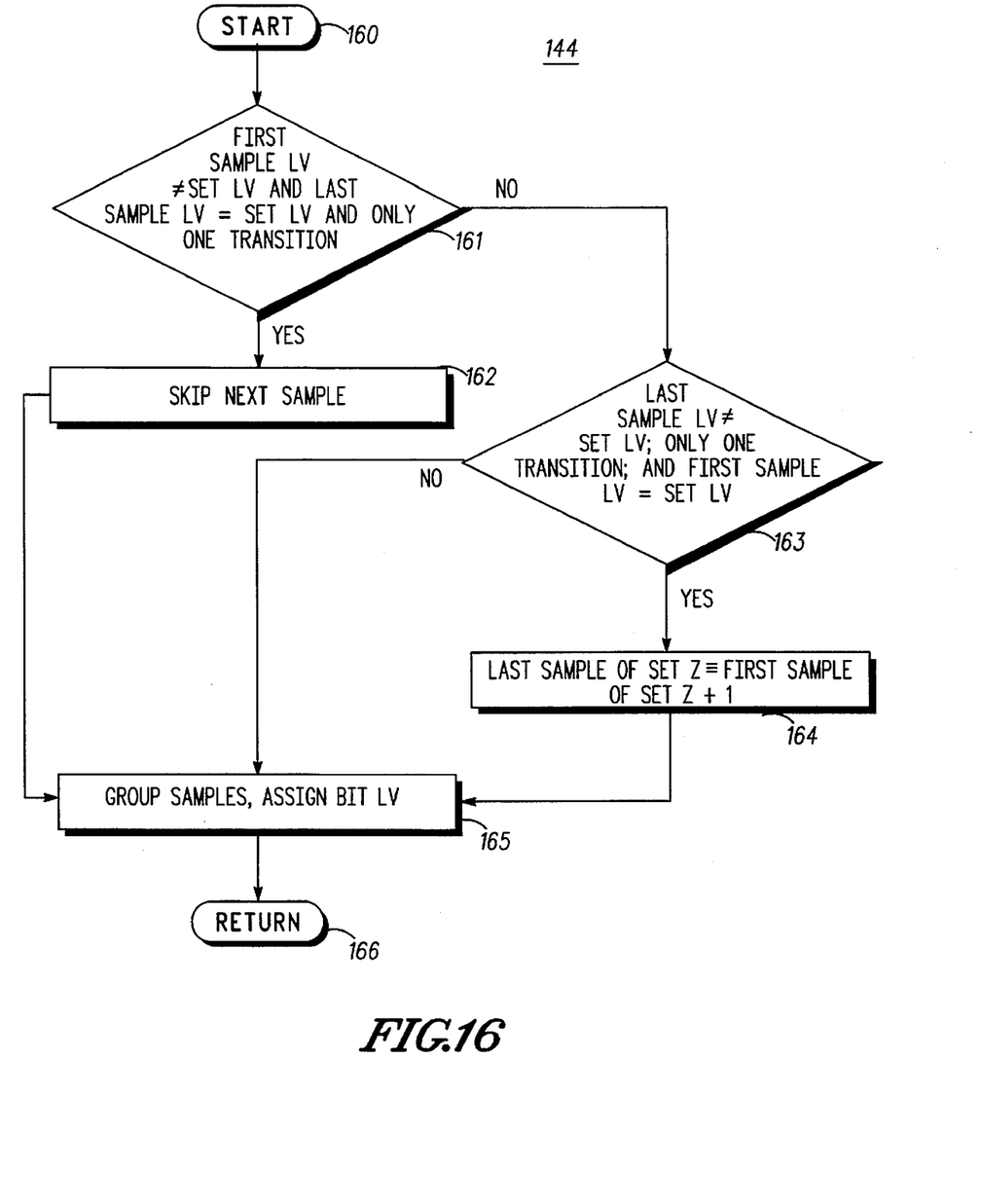
FIG. 16 is a flow chart illustrating a subprocess for determining the bit logic value of the process of FIG. 13.

Subprocess 144 is illustrated in more detail in FIG. 16. The subprocess begins at step 160 and proceeds to decision step 161. If the first sample logic value (L.V.) is not equal to the set logic value; and the last sample logic value is equal to the set logic value; and there is only one logical transition from the first sample to the last sample in the set, then subprocess 144 will skip the next sample, step 162. This is demonstrated using the following series:

01111111110000011111.

The first five samples are then placed in a set,

[01111]11111110000011111, which has a set logic value of "1". Since the first sample logic value, "0", is not the same as the set logic value; and the last sample logic value "1" is the same as the sample logic value; and there is only one transition, then the next sample value will be skipped, step 162. This will provide the following sequence.

[01111]X[11111] [00000] [11111], or a bit logic value of "1101" when the bit logic values are assigned in step 165.

If one or more of the criteria of decision step 161 are not met, then subprocess 144 jumps to decision step 163. In decision step 163, it is determined if the last sample logic value is not the same as the set logic value; if there is only one transition during the set samples; and if the first sample is the same as the set logical value. If these conditions are met, then the last sample of one set (Z) is used as the first sample of the next set (Z+1), step 164. This will be demonstrated using the following sample stream:

[11110]00000000011111111000000.

The conditions of decision step 163 are met by the first set. Therefore, the last sample "0" of the first set will be used as the first sample of the second set,

[1111 [0]0000] [00000] [11111] [1110 [0] 0000].

The third and fourth sets would not meet either of the criteria of decision steps 161 or 163. Therefore, subprocess 144 would not adjust these samples. The fifth bit has the same problem as the first bit, and would be adjusted in the same manner.

Once the sets have been adjusted, the bit values are assigned, step 165, and the subprocess returns, step 166.

Applying this subprocess to the sample logic values in FIG. 15 would provide a first bit logic value of "1" using the first five samples. The second set would then be adjusted to consist of samples 5 through 9 and result in a logical value of "0" for the second bit. The third and fourth sets would then proceed normally resulting in logical "0" and "1" bits, respectively. The fifth set would consist of samples 20 through 24 and would be assigned a logic value of "1". The sixth set would then be adjusted to comprise bits 24 through 28. This process would continue until all 24 DSAT bits were decoded for comparison with the valid DSAT codes.

Therefore, methods for decoding a digital signal have been described which do not require a delay time for the circuitry to adjust; and will improve the efficiency by eliminating many errors that prevent a valid DSAT from being detected.

Thus, it will be apparent to one skilled in the art that there has been provided in accordance with the invention, a method for decoding a digital signal that fully satisfies the objects, aims, and advantages set forth above.

While the invention has been described in conjunction with specific embodiments thereof, it is evident that many alterations, modifications, and variations will be apparent to those skilled in the art in light of the foregoing description. Accordingly, it is intended to embrace all such alterations, modifications, and variations in the appended claims.

We claim:

1. A method for decoding a digital signal by a decoding circuit comprising the steps of:

sampling an analog signal to obtain a plurality of samples;

calculating a mean value of a portion of said samples;

locating a reference sample crossing said mean value;

selecting a start sample based on the located reference sample crossing; and reading a first bit of said start sample of said digital signal.

2. The method of claim 1 wherein said mean value of said samples comprises a mean value range.

3. The method of claim 1 wherein the step of calculating the mean value comprises the steps of:

locating a maximum sample value of said portion of said samples;

locating a minimum sample value of said portion of said samples; and calculating an average of said maximum and minimum sample values.

4. The method of claim 3 further comprising the steps of:

determining a size of a range about said mean value; and forming a mean range about said mean value.

5. The method of claim 1 wherein said step of selecting said start sample comprises the step of performing a modulo calculation on a window crossing sample number.

6. The method of claim 1 further comprising the steps of:

A) initializing a bit counter and a sample counter based on the start sample and first bit;

B) incrementing said bit and sample counters to determine a sample group;

C) calculating a group mean value for said sample group;

D) determining a logical value of a bit based on said group mean value; and

E) repeating steps B–D until said digital signal comprising a predetermined number of bits has been determined.

7. The method of claim 6 wherein said step of determining said logical value of said bit comprises the steps of:

assigning a "1" logical value to a sample of said bit if said sample is greater than said group mean value of said sample group;

assigning a "0" logical value to a sample of said bit if said sample is not greater than said group mean value of said sample group; and assigning said logical value to said bit based upon a majority vote of said samples in said sample group.

8. The method of claim 1 wherein said digital signal is a Digital Sub-Audible Tone (DSAT) signal.

9. The method of claim 1 wherein each of said samples is a voltage sample of said digital signal.

10. A method for decoding a digital signal comprising the steps of:
- A) sampling an analog signal to obtain a plurality of digital samples;
- B) calculating a mean value of a portion of said digital samples;
- c) locating a reference sample crossing said mean value;
- D) selecting a start sample based on said located reference sample crossing;
- E) reading a first bit of said digital signal;
- F) initializing a bit counter and a sample counter based on said start sample and first bit;
- G) incrementing said bit counter and incrementing said sample counter to determine a sample group;
- H) calculating a group mean value for said sample group;
- I) determining a logical value of a bit based on said group mean value; and
- J) repeating steps G–I until said digital signal comprising a plurality of bits has been determined.

* * * * *